(12) United States Patent
Lim

(10) Patent No.: US 6,583,662 B1
(45) Date of Patent: Jun. 24, 2003

(54) CIRCUIT AND METHOD FOR IMPLEMENTING AN INTEGRATED CONTINUOUS-TIME SMOOTHING FILTER

(75) Inventor: Drahoslav Lim, San Diego, CA (US)

(73) Assignee: GlobespanVirata, Inc., Red Bank, NJ (US)

( * ) Notice: Subject to any disclaimer, the term of this patent is extended or adjusted under 35 U.S.C. 154(b) by 0 days.

(21) Appl. No.: 09/602,413

(22) Filed: Jun. 23, 2000

Related U.S. Application Data

(60) Provisional application No. 60/140,586, filed on Jun. 23, 1999.

(51) Int. Cl.[7] ................................................. H03K 5/00
(52) U.S. Cl. ....................................... 327/553; 327/558
(58) Field of Search ................................ 327/552, 553, 327/554, 555, 556, 557, 558, 559; 330/305; 333/172, 173, 176

(56) References Cited

U.S. PATENT DOCUMENTS

| | | | | |
|---|---|---|---|---|
| 4,101,881 A | * | 7/1978 | De Freitas | ................... 340/347 |
| 4,383,229 A | * | 5/1983 | Jones | .......................... 333/176 |
| 5,455,582 A | * | 10/1995 | Valdenair | ..................... 341/154 |
| 5,466,976 A | * | 11/1995 | Ichihara | ....................... 333/173 |
| 5,647,005 A | * | 7/1997 | Wang et al. | .................... 381/62 |

* cited by examiner

Primary Examiner—Dinh T. Le
(74) Attorney, Agent, or Firm—Thomas, Kayden, Horstemeyer & Risley

(57) ABSTRACT

A continuous-time smoothing filter circuit and method for implementing the same are disclosed. The circuit may be implemented as a cascade of two sections. The first section may comprise two programmable $3^{rd}$ order low-pass filters, each filter having a low Q value complex pole pair, as well as, a negative real pole. The second section may comprise an output stage amplifier having a low output impedance in order to drive external loads. Each of the $3^{rd}$ order low-pass filters may be under programmable control to select and coarsely tune the cut-off frequency for each of the two filters. In its broadest terms, the method of the present invention can be described as: processing a digital to analog converter generated output signal with a first $3^{rd}$ order low-pass filter; processing a first output signal provided by the first $3^{rd}$ order low-pass filter with a second $3^{rd}$ order low-pass filter; and processing a second output signal provided by the second $3^{rd}$ order low-pass filter with a low-output impedance amplifier.

33 Claims, 11 Drawing Sheets

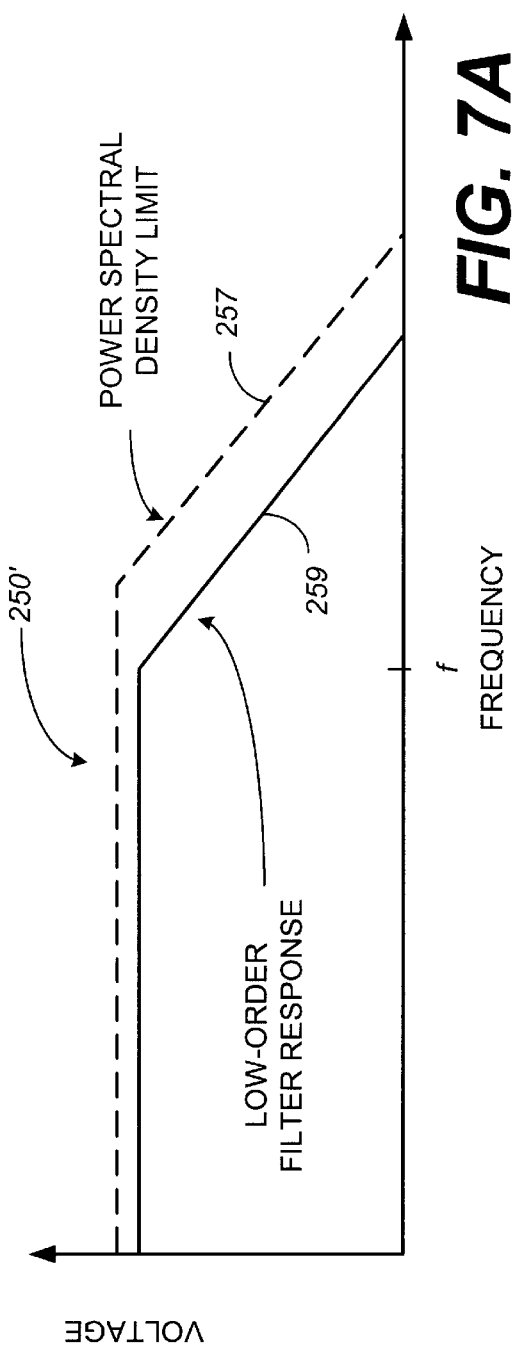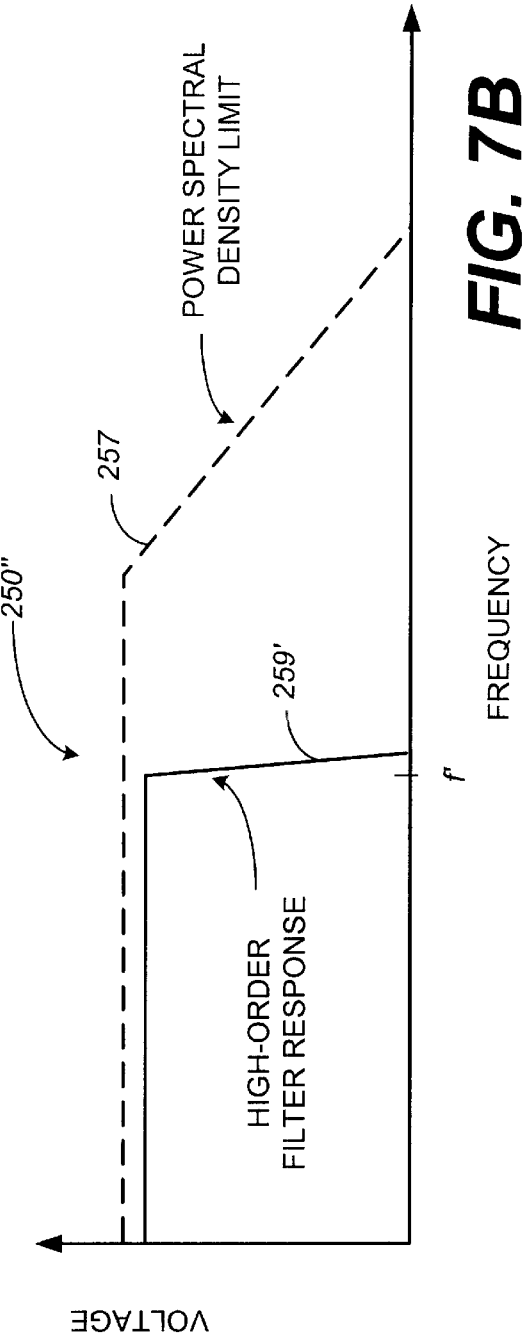

CIRCUIT AND METHOD FOR IMPLEMENTING AN INTEGRATED CONTINUOUS-TIME SMOOTHING FILTER

CROSS-REFERENCE TO RELATED APPLICATION

The present application claims the benefit of abandoned U.S. provisional patent application, issued Ser. No. 60/140, 586, and filed Jun. 23, 1999, which is hereby incorporated by reference in its entirety.

FIELD OF THE INVENTION

The present invention generally relates to high speed data communications wherein signal information is processed both in digital and analog forms. More specifically, the invention is related to an adaptable smoothing filter, which solves problems associated with integration density, power consumption, and the need for an external non-integrated transmit filter and a buffer for asymmetric digital subscriber line circuit cards.

BACKGROUND OF THE INVENTION

With the advancement of technology, and the need for instantaneous information, the ability to transfer digital information from one location to another, such as from a central office (CO) to a customer premise (CP), has become more and more important.

In a digital subscriber line (DSL) system, data is transmitted from a CO to a CP via a transmission line, such as a two-wire pair, and is transmitted from the CP to the CO as well, either simultaneously or in different communication sessions. The same transmission line might be utilized for data transfer by both sites or the transmission to and from the CO might occur on two separate lines. In its most general configuration, a DSL circuit card at a CO is comprised of a digital signal processor (DSP) which receives information from a data source and sends information to an analog front-end (AFE). The AFE serves as the interface between an analog line, such as the two-wire pair, and the DSP. The AFE converts digital data, from the DSP, into a continuous-time analog signal when processing data from the CO to the CP. The AFE also converts a received continuous-time analog signal into a digital data stream when processing data that originates at the CP that is sent to the CO. A digital to analog converter (DAC) may be followed in series by a clocked (sampled-data) analog switched-capacitor (SC) filter. Residual high-frequency energy, either spectral images resulting from digital sampling or high-frequency content from other sources not removed by the SC filter, may have to be removed as necessary to comply with output signal standards. More specifically, the residual high-frequency energy should be removed in order to meet or exceed the prescribed spectral energy mask of the particular communication standard.

A smoothing filter typically receives an input signal comprising a number of discrete magnitudes that remain relatively constant over each DAC clock period and corresponding to the resolution of the DAC. The DAC output signal may be filtered by a SC filter before being forwarded to the input of the smoothing filter. Since the output of the SC filter may comprise a clocked or sampled signal, the smoothing filter may be used to complete the digital to analog signal conversion process by creating a more analog like continuous signal.

Continuous-time smoothing filters are traditionally implemented as low-order filters, which typically seek to remove spectral images due to conversion from sampled continuous-time signals. The task of transmit signal filtering is usually left to off-chip filters. Furthermore, integrated continuous-time smoothing filters traditionally do not seek to drive off-chip loads.

For the continuous-time smoothing filter to be integrated, it has to make use of available on-chip components, typically, amplifiers, resistors, and capacitors. These integrated components typically have relatively large manufacturing tolerances. As a result, an integrated circuit that relies on the resistance and capacitance values of the various components of the circuit, such as a smoothing filter, must be over designed in order to function correctly or the circuit must be adjustable to compensate for the integrated component manufacturing variations. The precision of the adjustment or compensation depends on the filter performance requirements. The output of a continuous-time smoothing filter can be brought under a prescribed spectral mask using a number of various filter types. However, if power dissipation and hence the number of operational amplifiers, and filter accuracy are issues for the overall AFE, the selection of an appropriate filter type becomes more difficult.

For example, a $3^{rd}$ order Chebyshev filter would suffice, but it would require rather accurate adjustment in order to realize appropriate cut-off frequencies for CO-xDSL transmit applications. A $4^{th}$ order filter reduces the accuracy requirements to 3-bits, but the pole Q of the filter becomes too high for a single operational amplifier filter to meet the spectral mask required for a xDSL transmit signal. If a $6^{th}$ order filter was used, the smoothing filter would not need to be tuned at all. However, such a filter would require no less than 5 operational amplifiers (resulting in a significant power requirement) to realize the relatively high pole-Q values needed to meet the required transfer function.

The overall functionality of an AFE is particular to the specific DSL application, wherein factors such as signal bandwidth, data rate, data reach, signal quality, power budget, and different applicable standards combine to determine the optimum AFE. In order to minimize application specific implementations of AFEs across the many DSL applications, it is desired to create a high-performance configurable AFE. Considering the many flavors of asymmetric DSL (ADSL) applications, the adaptability problem becomes more apparent. Focusing on ADSL applications, there are a number of different implementation standards including: discrete multi-tone (DMT) T1.413, discrete multi-tone-frequency division multiplexed (DMT-FDM), discrete multi-tone-echo cancelled (DMT- EC), discrete multi-tone-G.lite (DMT-G.lite), carrierless amplitude/phase—rate adaptive digital subscriber line (CAP-RADSL), and discrete multi-tone over integrated services digital network (DMT-ISDN). Hereinafter, the aforementioned ADSL applications will be denoted xDSL. For each xDSL application, the optimum AFE configuration varies. Subsequently, the overall AFE configuration and the configuration of an anti-aliasing filter within the AFE may vary accordingly.

In CO-DSL modem applications, multiple DSL transceivers may be co-located within the same equipment or even located on the same printed circuit board. Competitive local-exchange carriers (CLECS) often rent equipment space from the various local telephone companies on a volume basis. As a result, DSL transceiver density and power efficiency are important factors for CLECs to consider when entering local DSL service markets. Transceiver density and power efficiency are important to the various telephone companies as well, as higher transceiver density and reduced power requirements directly reduce overhead and operating costs, respectively, for the CO operators.

Transceiver density is a function of the minimum necessary component area to construct the various circuits of the transceiver and the required transmit power of each transceiver. DSPs and the various other components within the transceiver need power in order to function. The desired movement of electrons to, from, and through the various components encounters resistance, which leads to the dissipation of heat. Generally, the faster DSPs and the other components are run, the more power the devices need to overcome resistance and the more power will be dissipated within the various circuits of the transceiver. Furthermore, transmit power and power dissipation requirements directly influence component sizes. As a result, transmit power and power dissipation requirements become limiting factors for transceiver density. Accordingly, there is a need for a highly integrated AFE circuit that removes the requirement for external filters and buffers while retaining the capability to support multiple ADSL communications standards.

SUMMARY OF THE INVENTION

In light of the foregoing, the invention is a continuous-time smoothing filter that may be used as the output stage of a high-performance AFE with an increased integration level that accommodates multiple xDSL applications in a power efficient manner. The continuous-time smoothing filter of the present invention permits the removal of an external filter device at the CO end of a xDSL communications link. It will be appreciated by those skilled in the art that the removal of an external transmit filter and a related buffer provides a significant improvement in integration density and power consumption. Often the individual components used in the prior art external devices can be quite large in relation to the DSP and the AFE, which in a preferred embodiment may be implemented in application specific integrated circuits (ASICs). In general, an AFE can be described in terms of a transmit or downstream data path and a receive or upstream data path.

The transmit path may contain a 1-bit digital to analog converter (DAC), a switched-capacitor (SC) filter, a DAC buffer, and a continuous-time smoothing filter. Under normal operating conditions, an external transmit filter is no longer required but can be driven by a high-performance AFE equipped with a continuous-time smoothing filter in accordance with the present invention. The receive path may contain a hybrid amplifier, a programmable gain amplifier (PGA), an anti-aliasing filter (AAF), an analog to digital converter (ADC) buffer, and an over sampling ADC.

A continuous-time smoothing filter in accordance with the present invention may comprise a cascade of three sections, the first two each realizing a $3^{rd}$ order transfer function. The third section may incorporate a low-output impedance amplifier comprising a source or emitter follower circuit. The continuous-time smoothing filter can remove significant high-frequency energy from the AFE transmit path signal with a narrow transition band without requiring more than one operational amplifier per three filter poles, high-Q filter functions, or precise filter adjustments. A continuous-time smoothing filter in accordance with the present invention requires only coarse filter adjustment and low-Q poles and is capable of driving a significant off-chip load without requiring a separate transmit buffer amplifier.

In addition, the cut-off frequency of the transmit path continuous-time smoothing filter and of the receive path AAF filter may be "calibrated" or adjusted simultaneously during an analog loop back made possible by the test MUX of the AFE. No separate tuning is required during nominal circuit operation.

The present invention can also be viewed as providing a method for implementing a continuous-time smoothing filter. In this regard, the method can be broadly summarized by the following steps: processing a digital to analog converter generated output signal with a first $3^{rd}$ order low-pass filter; processing a first output signal provided by the first $3^{rd}$ order low-pass filter with a second $3^{rd}$ order low-pass filter; and processing a second output signal provided by the second $3^{rd}$ order low-pass filter with a low-output impedance amplifier.

Other objects, features, and advantages of the present invention will become apparent to one skilled in the art upon examination of the following drawings and detailed description. It is intended that all such additional objects, features, and advantages be included herein within the scope of the present invention, as defined by the claims.

BRIEF DESCRIPTION OF THE DRAWINGS

The present invention will be more fully understood from the detailed description given below and from the accompanying drawings of the preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

FIGS. 7A and 7B illustrate the relationship between a low-order filter response and a high-order filter response that may be implemented in the smoothing filter of the high-performance AFE of FIG. 4.

DETAILED DESCRIPTION OF THE PREFERRED EMBODIMENT

Figure 1:
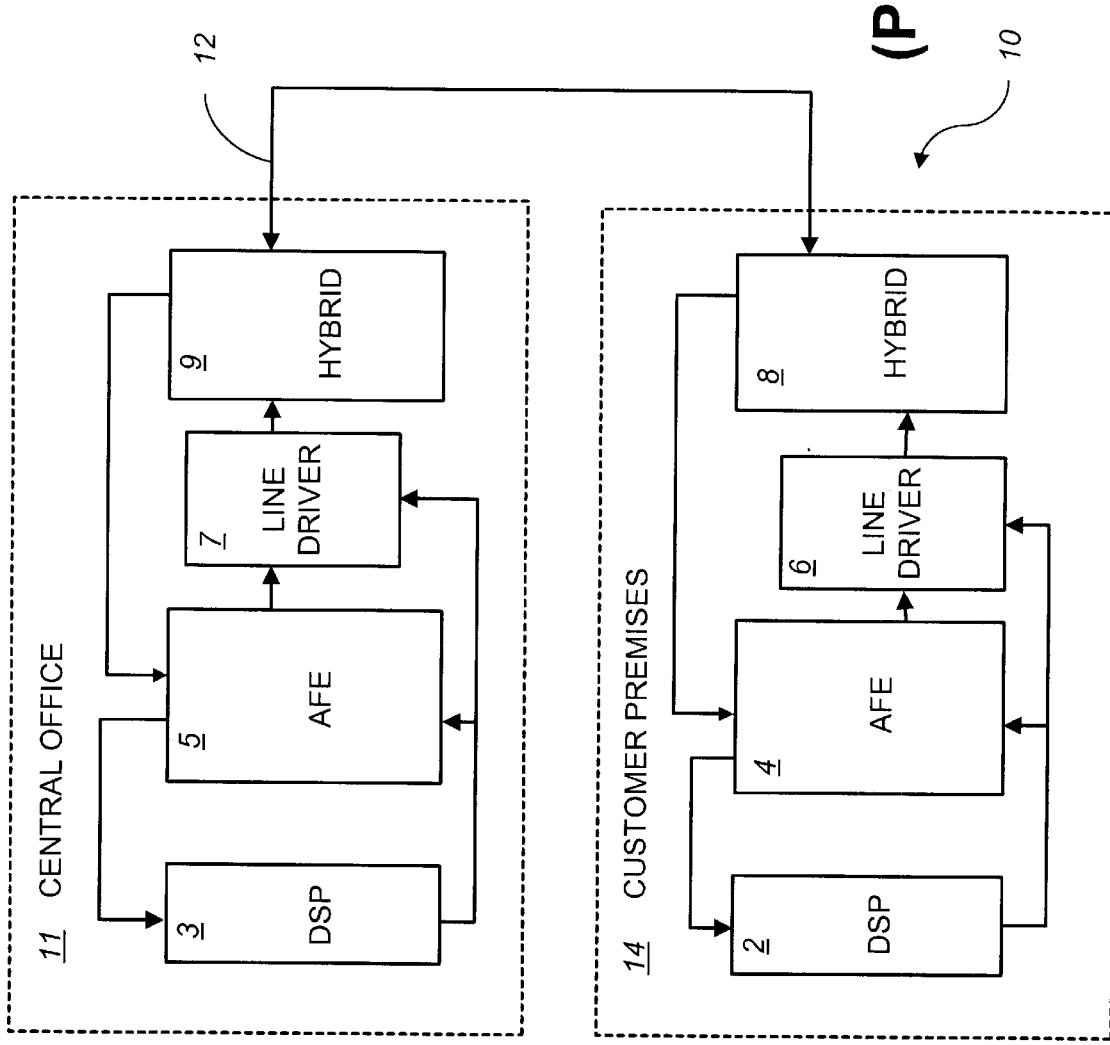
FIG. 1 is a prior art functional block diagram illustrating the various elements in a DSL communications link between a CO and a CP.

Turning now to the drawings, wherein like referenced numerals designate corresponding parts throughout the drawings, FIG. 1 shows a prior art high level representation of a DSL communications link 10 utilizing a CO-AFE 5, as well as other functional devices to support the DSL communications link 10. The DSL communications link 10 of FIG. 1 illustrates transmission of data from a CO 11 to a CP 14 via a transmission line 12, such as, but not limited to, a two-wire pair as may be provided by a plain old telephone system (POTS) service provider to complete a designated link between a CO 11 and a CP 14 In addition, FIG. 1 further illustrates the transmission of data from the CP 14 to the CO 11 via the same transmission line 12. With regard to the present illustration, transmission of data may be directed from the CP 14 to the CO 11, from the CO 11 to the CP 14 or in both directions simultaneously. Furthermore, data transmissions can flow on the same transmission line 12 in both directions, or alternatively on separate transmission lines (one shown for simplicity of illustration). Each of the separate transmission lines may be designated to carry data transfers in a particular direction either to or from the CP 14.

The CO 11 may include a printed circuit line card (not shown) that includes a CO-DSP 3, which receives digital information from one or more data sources (not shown) and sends information to a CO-AFE 5. The CO-AFE 5 interposed between the transmission line 12 and the CO-DSP 3 may convert digital data, from the CO-DSP 3, into a continuous time analog signal for transmission to the CP 14 via the one or more transmission lines 12.

One or more analog signal representations of digital data streams supplied by one or more data sources (not shown) may be converted in the CO-AFE 5 and further amplified and processed via a CO-line driver 7 before transmission by a CO-hybrid 9, in accordance with the amount of power required to drive an amplified analog signal through the transmission line 12 to the CP 14. A CP-hybrid 8, located at the CP 14, may then be used to de-couple a received signal from the transmitted signal in accordance with the data modulation scheme implemented by the particular xDSL data transmission standard in use. The CP-AFE 4, located at the CP 14, having received the de-coupled received signal from the CP-hybrid 8, may then convert the received analog signal into a digital signal, which may then be transmitted to a CP-DSP 2 located at the CP 14. Finally, the digital information may be further transmitted to one or more specified data sources (not shown). The herein above description of a data transfer originating at the CO 11 and ending at the CP 14 will herein after be designated as a downstream data transfer. Similarly, data communicated across the transmission line 12 from the CO 11 to the CP 14 will herein after be designated as downstream data.

In the opposite data transmission direction, one or more digital data streams supplied by one or more devices in communication with the CP-DSP 2 at the CP 14 may be converted by the CP-AFE 4 and further amplified vi a CP-line driver 6. The CP-hybrid 8, located at the CP 14, may then be used to couple the intended analog representations of the various digital signals to a transmit signal in accordance with the data modulation scheme implemented by the particular xDSL data transmission standard in use. As will be appreciated by those skilled in the art, the CP-line driver 6 may work in tandem with the CP-hybrid 8 to transmit the various signals with the power required to drive an amplified analog signal through the transmission line 12 to the CO 11. The CO-AFE 5 may receive the data from the CO-hybrid 9, located at the CO 11, and may then convert the received analog signal into one or more digital signals, which may then be transmitted to the CO-DSP 3 located at the CO 11. Finally, the digital information may be further distributed to one or more specified data sources (not shown) by the CO-DSP 3. The herein above description of a data transfer originating at the CP 14 and ending at the CO 11 will herein after be designated as an upstream data transfer. Similarly, data communicated across the DSL communication link 10 from the CP 14 to the CO 11 will herein after be designated as upstream data.

Figure 2:
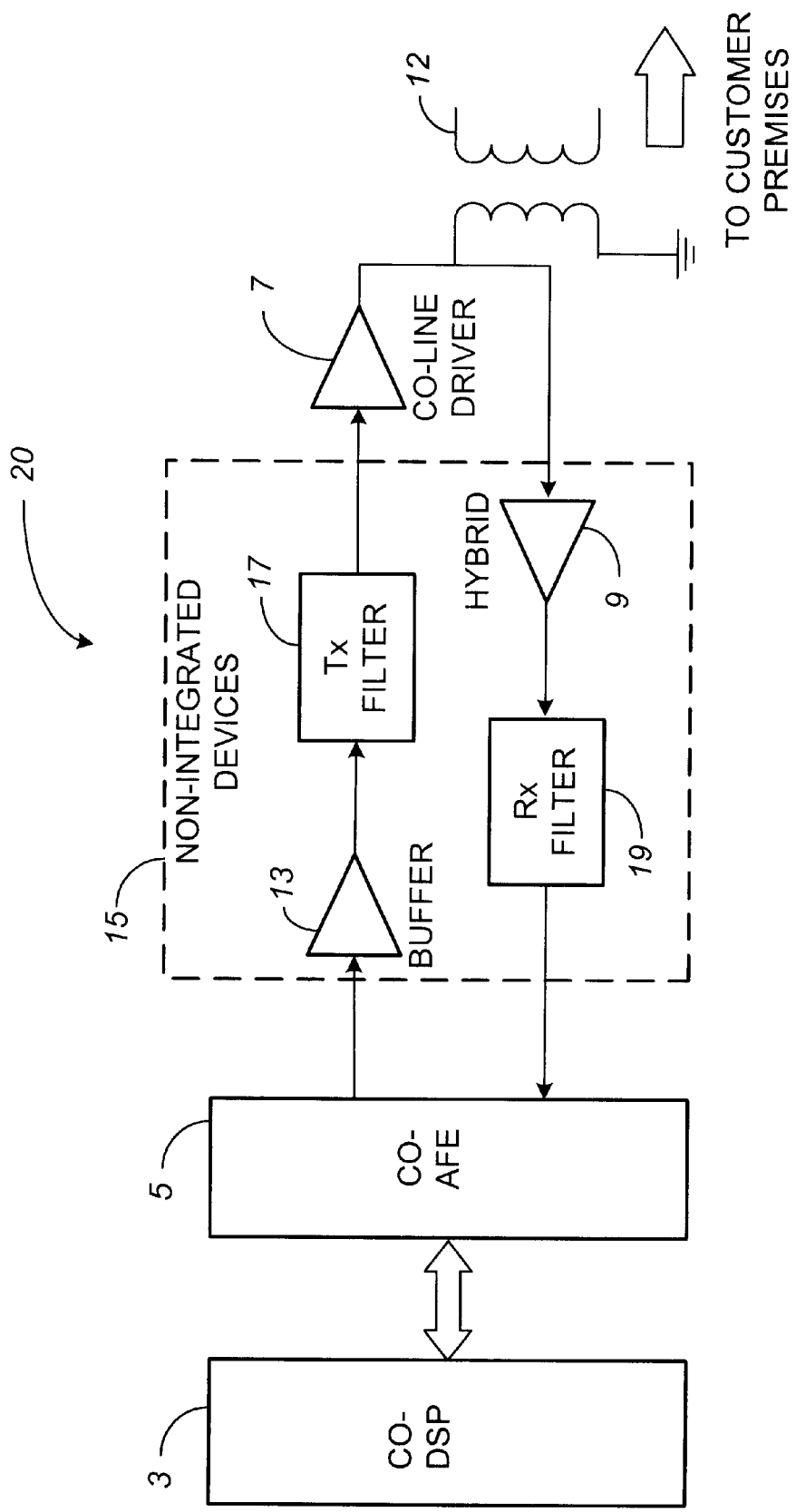
FIG. 2 is a top-level prior art illustration of a CO-DSL transceiver system of FIG. 1 that may utilize an AFE, which is separate from a line driver along with external transmit and receive filters, a transmit buffer, and a hybrid amplifier.

Having introduced and described in high level terms a prior art DSL communications link 10 with regard to FIG. 1, reference is now directed to FIG. 2, which presents a top-level prior art illustration of a CO-DSL transceiver system of FIG. 1 that may utilize an AFE. As illustrated in FIG. 2, the AFE may be separate from a CO-line driver along with external transmit and receive filters, a transmit buffer, and a hybrid amplifier. The CO-DSL transceiver system 20, as illustrated in FIG. 2 may comprise a CO-DSP 3, a CO-AFE 5, a plurality of non-integrated (external) devices 15, a CO-line driver 7, and a transmission line 12. The non-integrated (external) devices 15 may comprise a transmit filter 17 and a receive filter 19. One or more additional non integrated (external) devices 15 may be integrated with the CO-DSL transceiver system 20. As by way of a non-limiting example, a buffer amplifier 13 may be added in series with the transmit filter 17. Furthermore, a hybrid amplifier 9 may be added in series prior to the receive filter 19. As will be appreciated by those skilled in the art, the aforementioned non-integrated (external) devices 15 may in fact be required in order to meet xDSL communications link operational standards.

In the downstream direction, the CO-DSP 3 may be configured to receive digital information from one or more data sources (not shown) at the CO 11 (see FIG. 1). The CO-DSP 3 may be further configured to forward the received digital information to the CO-AFE 5. The CO-AFE 5 interposed between the transmission line 12 and the CO-DSP 3 may convert digital data, from the CO-DSP 3, into a continuous time analog signal for transmission to the CP 14 via the one or more transmission lines 12. One or more analog signal representations of digital data streams supplied by one or more data sources (not shown), may be converted in the CO-AFE 5 and further amplified and filtered in a buffer 13 and a transmit filter 17, respectively, to provide the CO-line driver 7 with a nominal analog signal before transmission through the transmission line 12 to the CP 14.

In the upstream direction, a hybrid amplifier 9 may be required to boost the analog signal strength of the received analog signal from the CP 14. The received and amplified analog signal from the hybrid amplifier 9 may be forwarded to a receive filter 19 which may be configured to filter the one or more analog downstream data transmissions present on the transmission line 12. The CO-AFE 5 may receive the data from the CO 11 located hybrid-amplifier 9 and may convert the received analog signal into one or more digital signals, which may then be transmitted to the CO-DSP 3. Finally, the digital information may be further distributed to one or more specified data sources (not shown) by the CO-DSP 3.

Figure 3:
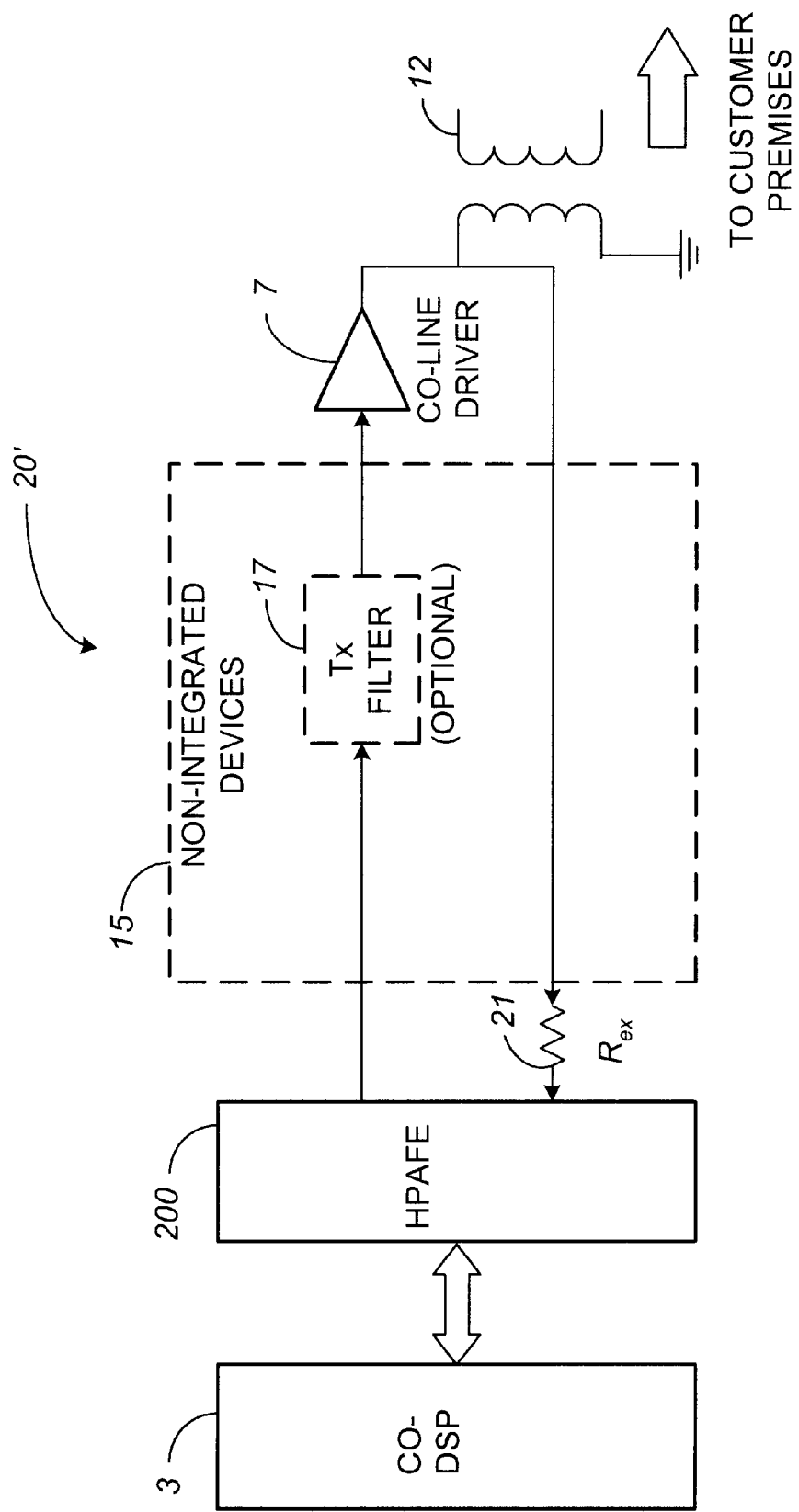
FIG. 3 is a top-level illustration of a CO-DSL transceiver system of FIG. 1 that may use a high-performance AFE to remove the external transmit buffer, the transmit and receive filters, and the hybrid amplifier from the CO-DSL transceiver system of FIG. 2.

Having introduced and described in high level terms a prior art DSL communications link 10 with regard to FIG. 1 and having described a top-level prior art illustration of a CO-DSL transceiver system 20 with regard to FIG. 2, reference is now directed to FIG. 3. In this regard, FIG. 3 provides a top-level illustration of an improved CO-DSL transceiver system of FIG. 2 that may use a high-performance AFE to remove the external transmit buffer 13, the transmit and receive filters 17, 19, respectively, and the hybrid amplifier 9 (of FIG. 2). More specifically, FIG. 3 illustrates an improved CO-DSL transceiver system 20' comprising a CO-DSP 3, a high-performance AFE (HPAFE) 200, a non-integrated (external) device 15, a CO-line driver 7, a transmission line 12, and an external resistor, designated $R_{ex}$ 21.

In the downstream direction, the CO-DSP 3 may be configured to receive digital information from one or more data sources (not shown) at the CO 11 (see FIG. 1). The CO-DSP 3 may be further configured to forward the received digital information to the HPAFE 200. The HPAFE 200 interposed between the transmission line 12 and the CO-DSP 3 may convert digital data, from the CO-DSP 3, into a continuous-time analog signal for transmission to the CP 14 (see FIG. 1) via the one or more transmission lines 12. An analog signal representation of one or more digital data streams supplied by one or more data sources (not shown), may be converted in the HPAFE 200 to provide the CO-line driver 7 with a nominal analog signal before transmission through the transmission line 12 to the CP 14 (see FIG. 1). It is significant to note that a HPAFE 200 provides a transmit path signal that meets or exceeds that required by the CO-line driver 7 in order to meet the transmission requirements of the various xDSL flavors previously referenced herein.

In the upstream direction, an external resistor 21 may be electrically coupled between the transmission line 12 and the HPAFE 200 to limit the voltage swing present at the upstream input to the HPAFE 200. The received analog signal from the transmission line 12 and the external resistor 21 may be processed by the HPAFE 200 where the received analog signal may be converted into one or more digital signals, which may then be forwarded to the CO-DSP 3. Finally, the digital information may be further distributed to one or more specified data sources (not shown) by the CO-DSP 3. It is significant to note that a HPAFE 200 provides an optimized and integrated configuration for the upstream path in the CO-DSL transceiver system 20'. In addition, the HPAFE 200 permits removal of the external upstream devices. The hybrid amplifier 9 and receive filter 19 of the prior art CO-DSL transceiver system 20 (see FIG. 2) may be replaced by a single external resistor 21 in the upstream signal path.

Figure 4:
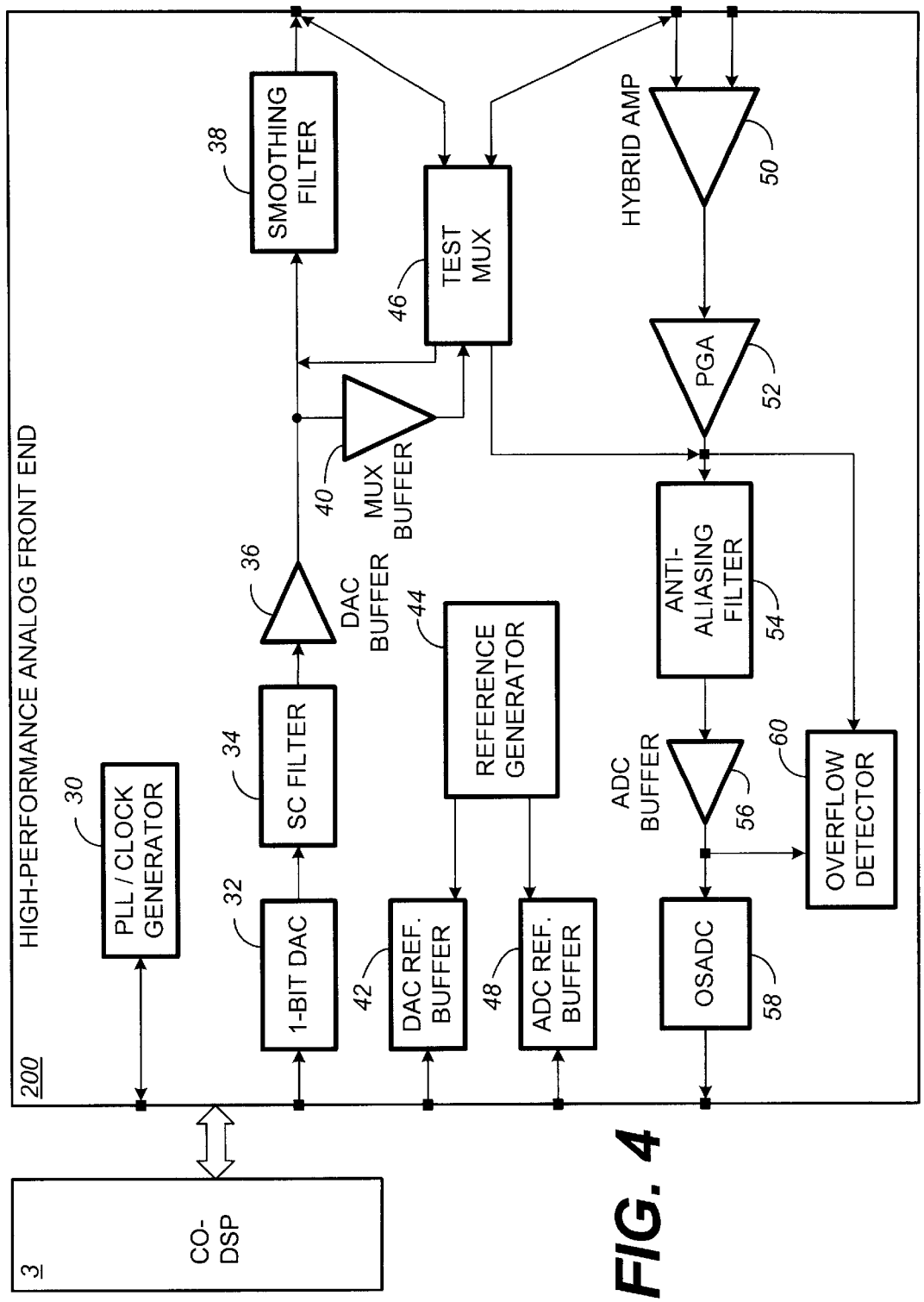
FIG. 4 is a block diagram illustrating the high-performance AFE Of FIG. 3.

Having previously described a prior art CO-DSL transceiver system 20 as illustrated in FIG. 2 and indicated how a HPAFE 200 may be integrated with an improved CO-DSL transceiver system 20' with regard to FIG. 3, reference is now directed to FIG. 4. In this regard, FIG. 4 is a block diagram illustrating the high-performance AFE of FIG. 3.

A HPAFE 200 may perform a number of functions as will be described in detail herein below, to provide for an optimized solution for the multiple variations of ADSL previously noted above. In this regard and as illustrated in FIG. 4, a HPAFE 200 may be described in terms of a transmit or downstream path, as well as, in terms of a receive or upstream path. The transmit or downstream path of the HPAFE 200 may comprise a 1-bit DAC 32, a switched-capacitance (SC) filter 34, a DAC buffer 36, and a smoothing filter 38. As further illustrated in FIG. 4, a receive or upstream path of the HPAFE 200 may comprise a hybrid amplifier 50, a PGA 52, an AAF 54, an ADC buffer 56, and an OSADC 58. As is further illustrated in FIG. 4, a number of peripheral support functions may be provided along with the previously introduced transmit and receive path devices. In this regard, the HPAFE 200 may also comprise a phase-locked loop (PLL)/clock generator 30, a reference generator 44, a DAC reference buffer 42, an ADC reference buffer 48 and an overflow detector 60. In addition, the HPAFE 200 may also comprise a MUX buffer 40 and a test MUX 46. As will be further described herein below, the test MUX 46 may be integrated with the HPAFE 200 in order to provide a port to observe the various inputs and outputs of the downstream and upstream devices within the HPAFE 200.

Downstream Data Processing in the HPAFE

Data transmissions from a CO 11 to a CP 14 as previously described with regard to FIGS. 1–2B are described in further detail herein below. In this regard, a digital Sigma-Delta modulator located in CO-DSP 3 may convert a high-resolution digital signal into an over sampled 1-bit signal. This 1-bit data stream may contain high-frequency quantization noise, which can be removed by a low-pass filter. The 1-bit DAC 32 of the HPAFE 200 receives the serial stream of digital data from the digital Sigma-Delta modulator in CO-DSP 3. The 1-bit DAC 32 may translate the binary number received into an analog signal. The 1-bit DAC 32 may be configured to run at a constant over sampling ratio independent of the xDSL-operating mode.

In order to accurately transform the digital pulse train into a continuous time analog signal without adding undesirable levels of noise and distortion, the analog signal provided by the 1-bit DAC 32 may be low-pass filtered by SC filter 34 to remove the raised truncation error in the over sampling 1-bit DAC 32. In addition, the SC filter 34 may also be configured to suppress signal components in the out-of-band spectrum in accordance with the xDSL standard. In order to save power, two operation modes may be realized in accordance with the power demands of the various xDSL standards. Due to the high operation frequency, a passive semi-digital FIR filter may be incorporated within the SC filter 34. The passive semi-digital FIR filter may be realized by sampling capacitors and may be configured to decimate the analog input signal by a predetermined factor. The predetermined decimation factor permits the SC filter 34 to be run at a fraction of the over sampling rate, greatly reducing design difficulties associated with high processing rates and power dissipation. Next, SC filter 34 removes part of the quantization noise generated in the Sigma-Delta modulator of the CO-DSP 3 (not shown) at the lower decimated sampling rate. Finally, SC filter 34 may use a sample and hold buffer to further process the analog information signal before forwarding the signal to the DAC buffer 36.

When a data signal is transmitted from a CO-DSP 3 to the HPAFE 200, the CO-DSP 3 may encode the data with a Sigma-Delta modulator (not shown) to enable generation of high-resolution waveforms in the HPAFE 200. During encoding there is an inherent design trade-off between signal bandwidth versus signal resolution through the selection of the over sampling ratio (OSR). As by way of example, if the Sigma-Delta modulator samples at 64 MHz, a signal bandwidth of 1 MHz may be used with an OSR of 32, or a signal bandwidth of 500 kHz may be used with an OSR of 64. Selecting the higher OSR would significantly improve the signal quality up to 500 kHz, while significantly degrading the signal quality from 500 kHz to 1 MHz. Thus, it is important to select the OSR in accordance with the different xDSL applications and various bandwidths confronted by the HPAFE 200.

Therefore, the SC filter 34 may be configured with a programmability feature which tracks the OSR utilized by the CO-DSP 3 and adopts the cut-off frequency of the SC filter 34 accordingly. Once the CO-DSP 3 OSR is known, the same OSR may be used in the SC filter 34 to reduce the magnitude of signals above the cut-off frequency, thereby increasing the resolution of signals within the bandwidth used for the data signal.

The output from the SC filter 34 may be buffered by DAC buffer 36 before being forwarded to the smoothing filter 38. Since signal distortion in the DAC buffer 36 varies directly with the bias current provided to the buffer (not shown), the bias current may be trimmed or limited at the input to the DAC buffer 36 in order to limit signal distortion that may be introduced by the DAC buffer 36.

To remove images caused by the sample and hold function of the SC filter 34 that were forwarded and amplified by the DAC buffer 36, the signal from the DAC buffer 36 may be further low-pass filtered by the smoothing filter 38. The smoothing filter 38 only needs to reject or remove the image at the multiple sampling rate of the SC filter 34 such that the output spectrum complies with the xDSL standard.

The output of the smoothing filter 38 can either go directly to the CO-line driver 7 (see FIG. 3), as may be the case when both the transmission and reception of information is performed in the same bandwidth, or to an external transmit filter 17 (see FIG. 3), as may be the case when transmission and reception of data is performed in different bandwidths. If the analog signal is transmitted to an external transmit filter 17 (see FIG. 3), the external transmit filter 17 removes out-of-band noise and distortion from the transmit-frequency band which falls into the receive-frequency band. As by way of example, if the frequency band allocated for transmission of the analog signal encompasses the range of 201 to 400 kHz and the frequency band allocated for reception of the analog signal encompasses the range of 50 to 200 kHz, the external transmit filter 17, filters the transmit-signal in the frequency range from 50 to 200 kHz.

Upstream Data Processing in the HPAFE

Referring now to the upstream data processing path illustrated in FIG. 4, the programmable hybrid amp 50 may receive both the upstream signal from the CP 14 and the transmitted downstream signal from the CO 11 (see FIG. 1). The programmable hybrid amp 50 and external components (not shown—see FIG. 2) may be configured to de-couple the received signal from the transmitted signal, by subtracting the transmitted signal from the sum of the transmitted and received signals. Other receive signal decoupling methods may be implemented in accordance with the xDSL standard currently in use as will be appreciated by those skilled in the art.

As illustrated in FIG. 4, programmable attenuation may be provided in two stages as may be provided by the programmable hybrid amplifier 50 and a PGA 52. Due to the large signal swing at the receive input to the HPAFE 200, an external resistor 21 may be provided as previously described with regard to FIG. 3. The external resistor 21 may be coupled in series with on-chip resistors (not shown for simplicity of illustration) such that the input voltage swing at the programmable hybrid amplifier 50 is less than a predetermined peak to peak voltage. Although each of the functional blocks illustrated on the HPAFE 200 illustrated in FIG. 4 is depicted in a single ended configuration with a single input and output signal path, it will be appreciated by those skilled in the art that a differential configuration for each of the various functional elements of the HPAFE 200 is contemplated and preferred. As by way of example, the output voltage of the programmable hybrid amplifier 50 may comprise the difference voltage of the differential input signal applied to its receive inputs and its hybrid inputs.

The programmable hybrid amplifier 50 may then be used to de-couple the received signal from the transmitted signal, by subtracting the transmitted signal from the sum of the transmitted and received signals. The removal of the transmitted signal from the received signal may be performed by adjusting the gain of the transmit-signal, otherwise referred to as hybrid gain, until the difference of what is received on the receive-port, minus the transmit-signal, is as small as possible. The optimum hybrid gain is a function of the line impedance, which can vary significantly depending upon line conditions, which can vary significantly based on a number of uncontrollable factors, such as bridge taps and wet lines. The gain of the programmable hybrid amplifier 50 may be adjusted by controllably applying a variable resistance (not shown for simplicity of illustration).

As further illustrated in FIG. 4, a second stage programmable amplification may be performed in the PGA 52. One distinct advantage related to the dual stage amplification is that the input receive signal can be controllably adjusted with at least two distinct levels of granularity. The achievable hybrid rejection, which measures how well the transmit-signal is rejected from the receive-signal, can thus be significantly improved.

The resulting receive-signal may then be amplified by PGA 52 until the receive-signal plus the non-attenuated transmit-signal becomes full scale. Typically, the available gain that can be implemented in PGA 52 is determined by the hybrid rejection, since the transmit-signal is significantly stronger than the receive-signal, and the signal out of the hybrid amplifier 50 is dominated by the transmit-signal. Thus, the required resolution of the receive path, tracks the hybrid rejection inversely. The receive-path needs to be able to recover the receive-signal as well as what is left of the transmit-signal. Any residual transmit-signal that remains when the upstream path is processed by the CO-DSP 3 may be subtracted in the digital domain.

When a signal is received by the HPAFE 200, PGA 52 amplifies both, high and low frequencies of the received signal. However, it is a well know fact that after transmission of a signal through a two-wire pair, lower frequencies of the transmitted signal are attenuated very little while higher frequencies are attenuated to a much higher degree. As such, the preferred embodiment of the invention provides for a high frequency boost option.

The PGA 52 may be configured to increase the high frequency spectrum of the received signal by amplifying a range of frequencies as predefined by a user. For some xDSL applications and conditions this is desirable, while for others it is undesirable, since the added high frequency amplification might add too much noise. As a result, a programmable high frequency amplification may be provided so that the frequency response of the receive path can be tuned according to various xDSL applications and conditions.

The AAF 54 and ADC buffer 56 may be configured to provide a low-pass filter with an adjustable cut-off frequency tailored to the particular xDSL application desired. The cut-off frequency is determined by the combination of a resistor and capacitor in a manner well known by those skilled in the art. The AAF 54 may be configured to prevent frequency spectrum aliasing due to periodic sampling of an analog signal. The AAF 54 may comprise a single Rauch-filter. It is significant to note that the AAF 54 may also serve as an integrated receive path filter.

In those operating modes where it is necessary to adjust the cutoff frequency of the Rauch-filter to remove the transmit frequency band from the upstream data, the HPAFE 200 takes advantage of the correlated variation in the adjustable on-chip resistors in the both the AAF 54 and the transmit path smoothing filter 38 by performing a single calibration at system initialization. The ADC buffer 56 may be required to drive a switched-capacitor load at the OSADC 58 input and may be interposed between the AAF 54 and the OSADC 58. Depending on the sampling rate which may depend upon the processing rate of the xDSL mode, the ADC buffer 56 may be operated in multiple power modes. Bias current can also be adjusted to limit distortion of the AAF 54 output signal.

The OSADC 58 samples the received signal at a rate much higher than the Nyquist sampling rate. OSADC 58 provides a high-resolution, low-distortion digital representation of the received upstream information signal to the xDSL CO-DSP 3. In order to successfully interface with the CO-DSP 3, the OSADC 58 may be a fourth order two-stage architecture. The OSR ratio may be adjusted depending on the transmit and receive bandwidth of the particular xDSL operating mode selected.

Peripheral Support Functions

The reference generator 44 and the PLL/clock generator 30 provide the necessary baseline signals to coordinate and direct operation of the various HPAFE 200 functional blocks responsible for analog to digital signal conversion and conversely, the digital to analog data conversion. The PLL/clock generator 30 may also provide timing signals needed to synchronize the input and output data interfaces, as well as, an external control interface to the HPAFE 200. The PLL/clock generator 30 may generate a clock for use in the SC filter 34 by dividing the frequency of the input signal by a predetermined decimating factor. In addition, the PLL/clock generator 30 may create the clock phases needed in the SC filter 34. The DAC reference buffer 42 may be interposed between the reference generator 44 and the 1-bit DAC 32 in order to drive the switched-capacitance load of the SC filter 34. Furthermore, the ADC reference buffer 48 may be interposed between the reference generator 44 and the OASADC 58. The implementation and application of the reference generator 44, the DAC and ADC reference buffers 42, 48, respectively, and the PLL/clock generator 30 throughout the HPAFE 200 will be appreciated and understood by those skilled in the art and need not be described in detail herein to appreciate the HPAFE 200 and the continuous-time smoothing filter 38 of the present invention.

In addition to the aforementioned peripheral devices, the HPAFE 200 of the present invention may also comprise an overflow detector 60 electrically coupled at both the output of the PGA 52 and the ADC buffer 56. The overflow detector 60 may comprise a peak detector configured to trigger a flag whenever an analog signal exceeds a predetermined peak voltage at the output of the PGA 52 or the ADC buffer 56. The gain of the PGA 52 may be adjusted so that amplification provided to the received data signal will be limited to a specific, predefined, magnitude, or voltage, thereby presetting the desired peak-to-peak voltage out of the Sigma-Delta modulator (not shown) of the CODSP 3. This feature is desirable since amplification of the receive-signal over a certain peak may cause clipping, and therefore, loss of data. Amplification over the peak may take place either after amplification by PGA 52, or following amplification in the ADC buffer 56. The predetermined peak voltage may be step-wise programmable and may be configured in accordance with the xDSL standard selected. The overflow detector 60 may be synchronized with the OSADC 58 clock and may be configured to set an asynchronous latch when a signal exceeds the programmed peak threshold. As will be appreciated by those skilled in the art, detection of the latch may be forwarded to firmware that may reconfigure one or more of the adjustable resistors that provide gain control for both the hybrid amplifier 50 and the PGA 52 in order to limit the analog signal below the predetermined peak voltage as required.

Internal Test Functions

An analog test MUX 46 may be located within the HPAFE 200 for purposes of providing direct paths throughout the HPAFE 200, thereby bypassing available alternative paths throughout the HPAFE 200 when not in use. While the applicability of the analog test MUX 46 is discussed with reference to multiple functions herein, it is necessary to note that the analog test MUX 46 also provides a means of applying an external signal into particular nodes within the HPAFE 200. As illustrated in FIG. 4, a first input to the analog test MUX 46 may be electrically coupled at the interface between the DAC buffer 36 and the smoothing filter 38. A second input to the analog test MUX 46 may be electrically coupled at the interface between the PGA 52 and the AAF 54. A first output from the analog test MUX 46 may be electrically coupled at the transmit path output, and a second output from the analog test MUX 46 may be electrically coupled at the receive path input.

Generally, the analog test MUX 46 may function by connecting either of the analog test MUX 46 inputs with the either of the analog test MUX 46 outputs. Since the outputs from the analog test MUX 46 share the transmit path output and one of the receive path inputs, the analog test MUX 46 may be used for automated tests and for debugging purposes. The input to the hybrid amplifier 50 that is not electrically coupled to the analog test MUX 46 may be further integrated with a dummy capacitive load to balance the extra capacitive load due to the analog test MUX 46. The impact of pin sharing at the interface of the HPAFE 200 is that under normal operation, the output pin of the smoothing filter 38 (in the transmit path) and the input pin of the hybrid amplifier 50 (in the receive path) see an extra capacitive load due to the internal switches within the analog test MUX 46.

Programmable RC-Filters Capable of Calibration via Internal or External Loop-Back Under Digital Control The HPAFE 200 may have implemented therein, a means of internally enabling calibration of the cut-off frequencies of the smoothing filter 38 and the AAF 54. Because of strict standards with respect to what signals a telephone service provider is allowed to put on a customer's line, the use of methods external to the HPAFE 200, for calibrating filters internal to the HPAFE 200 has been undesirable due to the need to use a customer's telephone line to perform the calibration. In response, an HPAFE 200 internal method of filter calibration is provided. In accordance with the preferred embodiment, a feed back path may be configured as follows. The output of the smoothing filter 38 may be transmitted to the CO-line driver 7, which, in turn, may be transmitted to the transmission line 12 and fed back into receive path via the programmable hybrid amplifier 50. In order to prevent the programmable hybrid amplifier 50 from,rejecting the transmitted signal, the programmable hybrid gain may be set to zero, in order to feed all the transmitted signal into the receive port without subtraction of the transmit-signal. After reception of the calibration signal by PGA 52 the cutoff-frequency of the AAF 54 may be adjusted accordingly to limit the energy in the receive-signal path to that received in the desired bandwidth.

During calibration of the AAF 54 the cut-off frequency of the smoothing filter 38 is maximized so that the monitored frequency response is solely determined by the cut-off frequency programmed in the AAF 54. The cut-off frequency can then be digitally calibrated until the response is as desired. Similarly, the cut-off frequency of the transmit path smoothing filter 38 can be monitored and adjusted keeping the corner frequency of the AAF 54 at the maximum value, such that the frequency response of the total signal path is determined by the frequency response of the smoothing filter 38 in the transmit path.

The actual cut-off frequency of any continuous time RC filter may inversely track the RC product of a given process, where R is the resistance value of the resistor used in the filter, and C is the capacitance value of the capacitor used in the filter. In typical complementary metal oxide semiconductor (CMOS) devices, the value of the RC product may vary by about 50%. This variation in CMOS integrated resistors and capacitors increases the inaccuracy of integrated RC filters. Inaccurate resistive and capacitive values lead to less rejection of unwanted signals. As a result, calibration under digital control is very attractive since it enables the user to tune the cut-off frequency to eliminate any process variations. Also, this feature enables the same filter to be used for a large range of cut-off frequencies, making it suitable for a larger span of xDSL applications.

Alternatively, the calibration signal may be inserted directly into the receive path without going out to the CO-line driver 7 (see FIG. 1). As a result, a calibration signal), which may interrupt other services, will not be applied to the transmission line 12 (see FIG. 1. By using the analog test MUX 46, the output of the transmit path smoothing filter 38 could be sent back into PGA 52 or the AAF 54 and the response again monitored at the output of the CO-DSP 3 Sigma-Delta modulator (not shown).

Selectable Data Rates

In order to prevent excessive power dissipation in the HPAFE 200 it is desirable to perform analog to digital conversion at a different sampling rate than digital to analog conversion if the receive and transmit bandwidths are different. As by way of example, if transmission of data is performed at high frequencies, while reception of data is performed at low frequencies, the high frequency path may be sampled at a higher rate than the low frequency path. As such, the transmission and reception of data at the same sampling rate results in unnecessary use of power in the receive path.

As a result, analog to digital and digital to analog conversion may be performed at different clock speeds. As previously described, a PLL/clock generator 30 may be used to synchronize data transfers between the HPAFE 200 and the CO-DSP 3 as well as with a CP 14. A divider/MUX (not shown) may receive a clock signal from the PLL/clock generator 30 and provide appropriate sampling rates to the 1-bit DAC 32, the SC filter 34 and a Sigma-Delta modulator (not shown) in the CO-DSP 3. It should be noted that one of reasonable skill in the art will appreciate that assignment of appropriate sampling rates need not be performed by a MUX, but instead, may be performed by other digital control logic.

To illustrate use of the divider/MUX (not shown), the following example is provided. If the clock rate at the input to the PLL portion of the PLL/clock generator 30 is 80 MHz and the transmission of data is performed at a higher frequency than the reception of data, the divider/MUX (not shown) may assign clock speeds of 80 MHz to the 1-bit DAC 32 and the SC filter 34, while assigning a clock speed of 40 MHz to the Sigma-Delta modulator. Alternatively, if the reception of data were performed at a higher frequency than the transmission of data, the divider/MUX (not shown) may assign a clock rate of 40 MHz to the 1-bit DAC 32 and the SC filter 34, while assigning a clock rate of 80 MHz to the Sigma-Delta modulator.

It should be noted that ratios of powers of two have been chosen here between the Sigma-Delta modulator (not shown) and the clock rate for internal HPAFE 200 processing units for simplicity, since the various clock ratios can be generated with a simple digital divider. This might, however, not be a requirement if more elaborate digital logic was used, or a higher PLL clock rate is applied.

Figure 5:
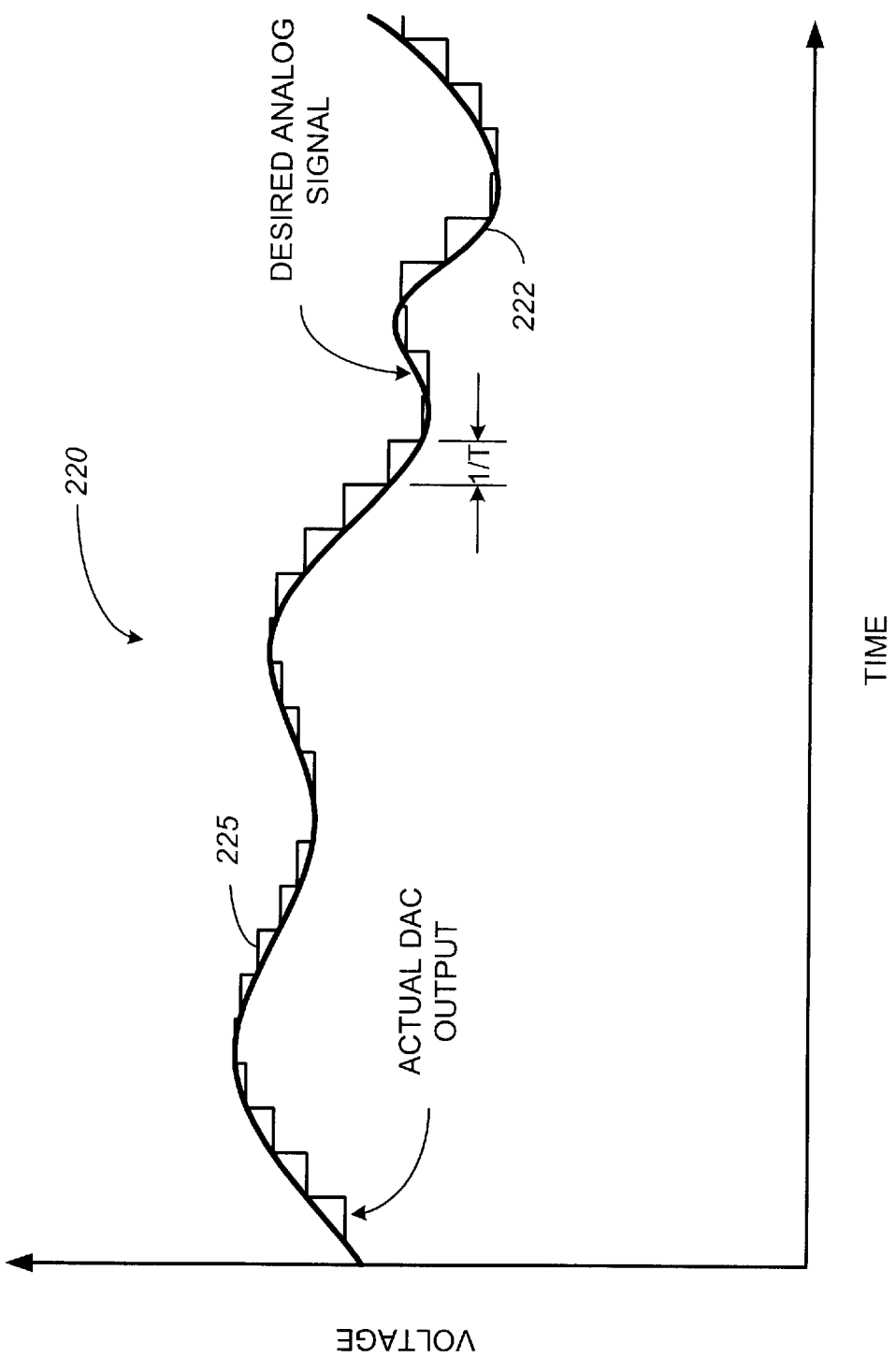
FIG. 5 is a plot illustrating both the desired analog signal and the actual output of the digital to analog converter of the high-performance AFE of FIG. 4.

Having described a HPAFE 200 with regard to FIG. 4, reference is now directed to FIG. 5. In this regard, FIG. 5 is a plot illustrating both the desired analog signal and the actual output of the 1-bit DAC 32 of the HPAFE 200 of FIG. 4.

More specifically, the plot 220 illustrates the relationship between a desired analog signal 222 and the actual output signal from the 1-bit DAC 32 herein labeled 225. As can be observed, the actual 1-bit DAC output signal 225 provides a stair-stepped function over time with the 1-bit DAC output signal 225 remaining constant over each clock period herein designated as 1/T, where T is the sampling clock period of the 1-bit DAC 32 (see FIG. 4). As may be further observed upon inspection of plot 220, the desired analog signal 222 is a continuous signal over time without the step discontinuities observed due to the available resolution of the 1-bit DAC 32 (see FIG. 4). As will be appreciated by those skilled in the art, plot 220 is generally representative of both a desired and an actual signal that may be associated with any digital to analog conversion. Both the desired analog signal 222 and the actual 1-bit DAC output signal 225 could be the result of any digital to analog conversion, and as such, are not limited the circuit of FIG. 4.

Figure 6:
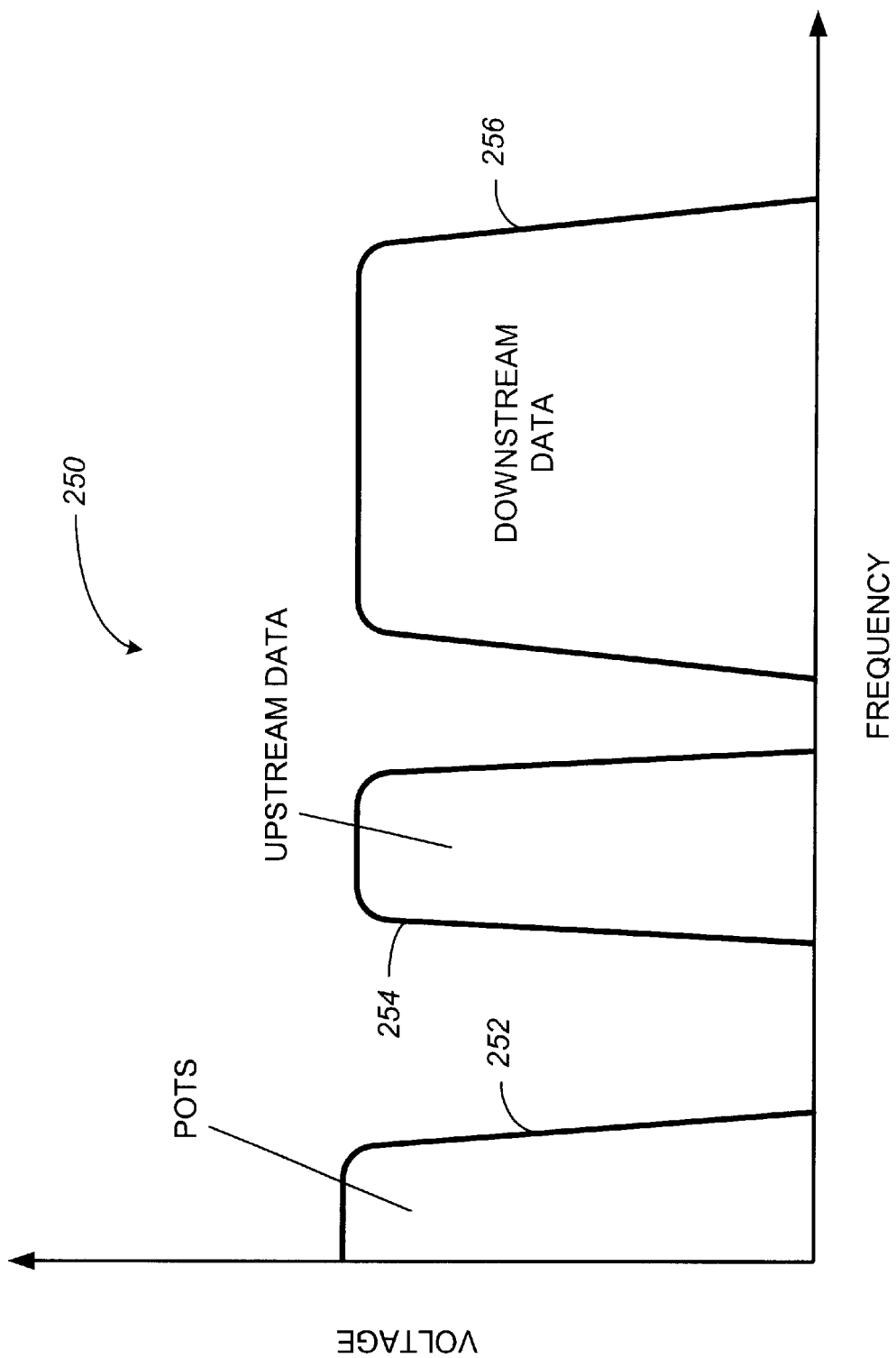
FIG. 6 is a plot illustrating a basic frequency allocation scheme that can be followed by the high-performance AFE of FIG. 4.

Having described a plot illustrating both the desired analog signal and the actual output of the 1-bit DAC 32 of the HPAFE 200 of FIG. 4 with regard to FIG. 5, reference is now directed to FIG. 6. In this regard, FIG. 6 is a plot illustrating a basic frequency allocation scheme that can be followed by the high-performance AFE of FIG. 4.

More specifically, the plot 250 illustrates the relationship between a POTS frequency bandwidth 252, a DSL upstream data frequency bandwidth 254, and a DSL downstream data frequency bandwidth 256. As illustrated in FIG. 6, the POTS frequency bandwidth 252 may comprise the lowest frequencies. Telecommunications standards generally set the POTS frequency bandwidth 252 from approximately 300 Hz to approximately 4 kHz.

As is further illustrated in FIG. 6, the DSL upstream data frequency bandwidth 254 may be separated and higher in frequency from the POTS frequency bandwidth 252. Furthermore, the DSL upstream data frequency bandwidth 254 is generally narrower than the higher frequency DSL downstream data frequency bandwidth 256, as it is often the case that downstream data requirements for DSL service subscribers will exceed upstream data bandwidth requirements. Last, DSL downstream data frequency bandwidth 256 appears in the highest frequencies and may range as high as 1 MHz for xDSL applications. FIG. 6 illustrates a frequency distribution scheme that separates the upstream data channel(s) from the downstream data channel(s). It will be appreciated by those skilled in the art that upstream and downstream data channels may coexist within the same frequency band with each having distinct data modulation schemes and coding techniques.

Having briefly described a frequency distribution scheme 250 with regard to FIG. 6, reference is now directed to FIGS. 7A and 7B. In this regard, FIGS. 7A and 7B introduce frequency plots illustrating the relationship between a low-order low-pass filter frequency response and a high-order low-pass filter frequency response. A power spectral density plot 250' as illustrated in FIG. 7A may comprise a power spectral density limit 257 as prescribed by a xDSL communication standard. As illustrated in FIG. 7A, the power spectral density limit 257 may limit DSL system signal transmissions in both the upstream and downstream directions to a particular magnitude as shown by the horizontal dashed-line segment. After a prescribed frequency, (not labeled) identifiable by the intersection of the downward sloping line and the aforementioned constant magnitude portion of the power spectral density limit 257, the magnitude of the power spectral density limit 257 of the power spectral density plot 250' may tail off until signals are no longer detectable due to high frequency attenuation of signals transmitted across a transmission line 12 (see FIG. 1).

As is further illustrated in FIG. 7A, a low-order low-pass filter response 259 may be characterized by a transfer function that allows frequencies below a corner frequency herein designated, f, to pass without attenuation. Thereafter, frequencies greater than the corner frequency, f, may be attenuated or filtered. As shown in FIG. 7A, low-pass filters with a relatively low-order or filter Q value will be characterized with a relatively low or shallow slope after the corner frequency.

Conversely, a high-order low-pass filter response, such as that illustrated in FIG. 7B, will be characterized by a relatively higher slope transfer function. More specifically, A power spectral density plot 250" as illustrated in FIG. 7B may comprise a power spectral density limit 257 as prescribed by a xDSL communication standard. As further illustrated in FIG. 7B, the power spectral density limit 257 may limit DSL system signal transmissions in both the upstream and downstream directions to a particular magnitude as shown by the horizontal dashed-line segment. After a prescribed frequency, (not labeled) identifiable by the intersection of the downward sloping line and the aforementioned constant magnitude portion of the power spectral density limit 257, the magnitude of the power spectral density limit 257 of the power spectral density plot 250" may tail off until signals are no longer detectable due to high frequency attenuation of signals transmitted across a transmission line 12 (see FIG. 1).

As is also illustrated in FIG. 7B, a high-order low-pass filter response 259' may be characterized by a transfer function that allows frequencies below a corner frequency herein designated, f', to pass without attenuation. Thereafter, frequencies greater than the corner frequency, f', may be attenuated or filtered. As shown in FIG. 7B, low-pass filters with a relatively high-order or filter Q value will be characterized with a relatively high or steep slope after the corner frequency. It will be appreciated by those skilled in the art that higher-order low-pass filters are desirable in that once the corner frequency, f', exceeds the upper edge of the downstream data frequency bandwidth 256 (see FIG. 6), the higher-order low-pass filter is not as dependent upon tuning or calibrating the position or frequency of the corner frequency, f', in order to remain below the power spectral density limit 257. Conventional $3^{rd}$ or higher order low-pass filters typically have pole Qs above 1, making it impractical to use circuit configurations having fewer amplifiers than one per filter pole.

Figure 8A:
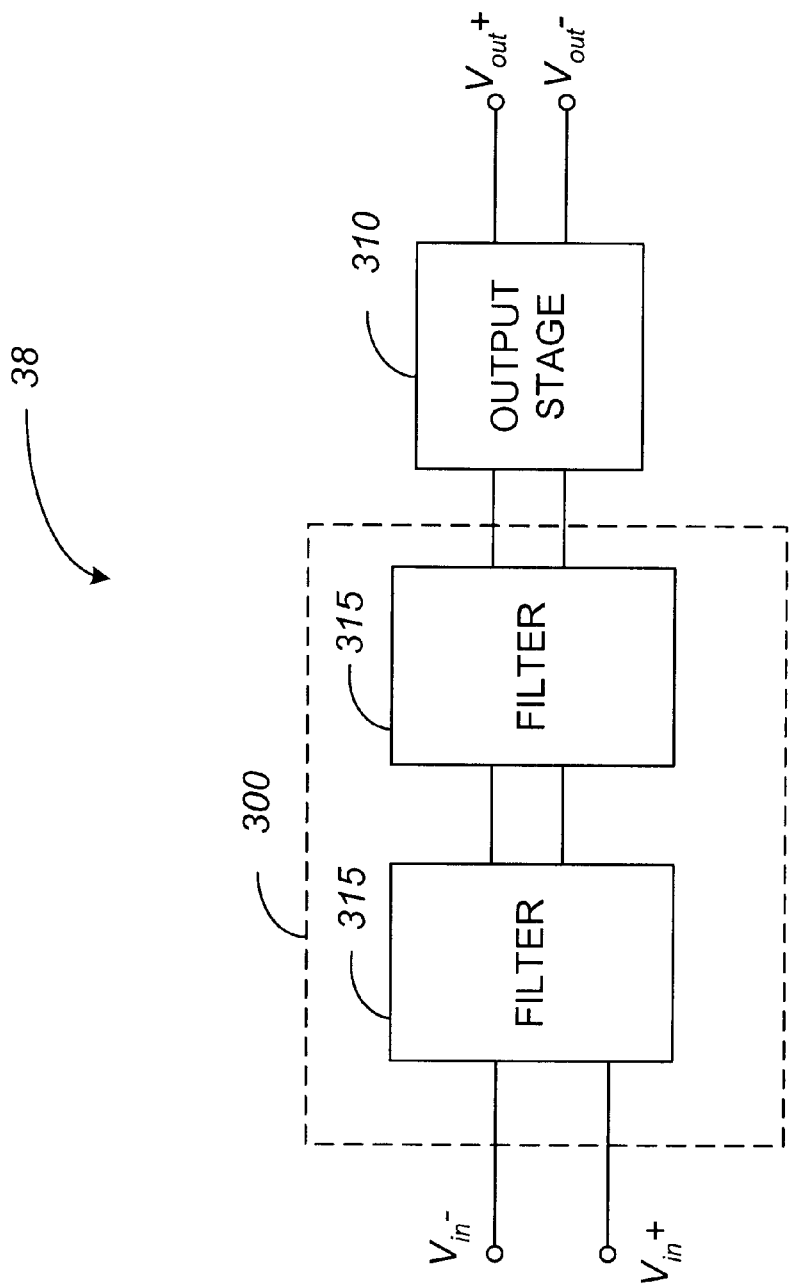
FIG. 8A is a functional block diagram illustrating a continuous-time smoothing filter in accordance with the teachings of the present invention.

A continuous-time smoothing filter 38 in accordance with the present invention; may be implemented as illustrated in FIG. 8A as a cascade of two sections. The first section, comprising a filter section 300, may further comprise a first filter 315 followed by a similarly configured second filter 315. Each of the filters 315 may realize a $3^{rd}$ order transfer function. Each $3^{rd}$ order filter may realize a negative real-pole and a complex, low-Q pole pairs. Each filter 315 may require only a single amplifier for the 3 poles, even in a fully differential version of the circuit (as will be shown with regard to FIG. 8C). For the purpose of this application, a low-Q is a Q value substantially less than 1. In a preferred implementation, the Q value is less than 0.9. This is comparable to a pole Q of a conventional $2^{rd}$ order-biquad filter. As stated previously, a conventional $3^{rd}$ order or higher-order filter has pole Qs above 1. As further illustrated in FIG. 8A, the differential output from the filter section 300 may be further coupled to a differential output stage 310.

A continuous-time smoothing filter 38 in accordance with the present invention may be inserted following the SC filter 34 in the upstream data path. The continuous-time smoothing filter 38 may function to suppress spectral images present in a sampled data signal, to remove 1-bit DAC 32 residual high-frequency components, and to drive the off-chip CO-line driver 7 (see FIG. 3).

Figure 8B:
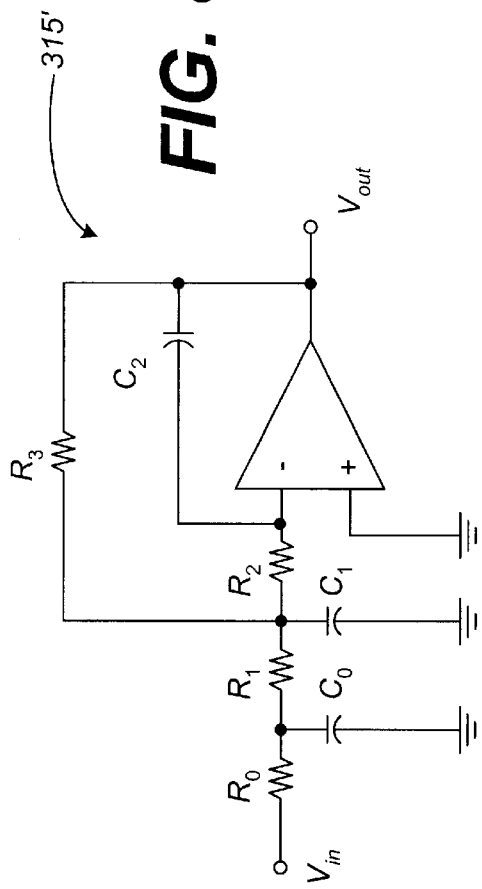
FIG. 8B is a circuit diagram of a single ended $3^{rd}$ order Rauch-filter that may be used to implement each of the filters of the continuous-time smoothing filter of FIG. 8A.

Having briefly introduced a continuous-time smoothing filter 38 in accordance with the present invention as illustrated in the functional block diagram of FIG. 8A, reference is now directed to FIG. 8B. In this regard, FIG. 8B is a circuit schematic of a single-ended $3^{rd}$ order Rauch-filter 315' that may be used to implement each of the filters 315 of the continuous-time smoothing filter of FIG. 8A. The components $R_0$ and $C_0$ contribute the real pole with the remaining components, including the operational amplifier, contributing to the complex pole pairs.

Figure 8C:
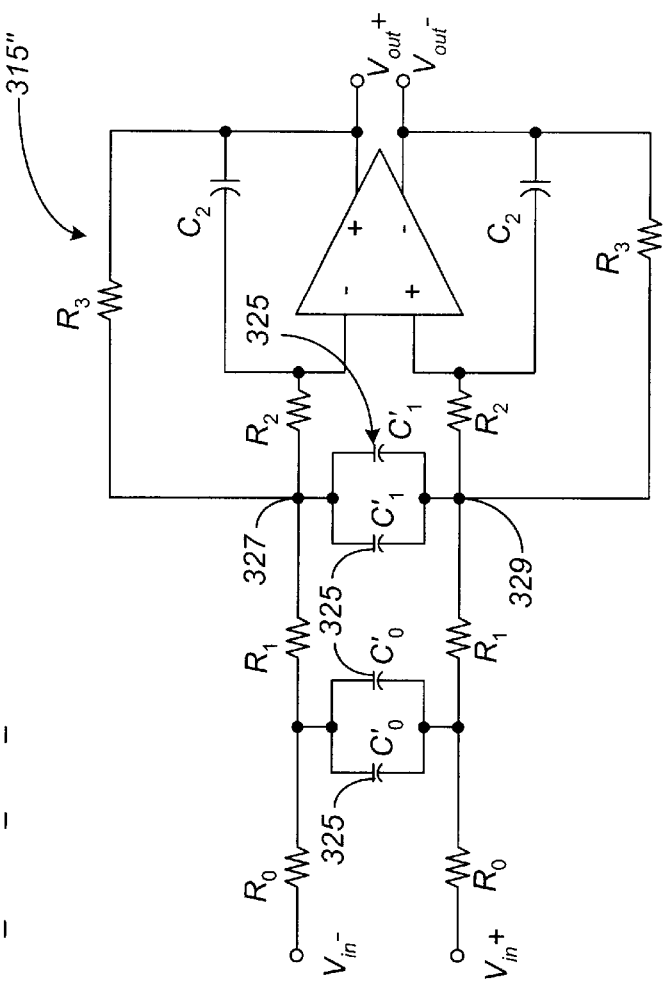
FIG. 8C is a circuit diagram of a differential version of the 3order Rauch-filter of FIG. 8B.

The fully differential version of the circuit illustrated in FIG. 8B is illustrated in FIG. 8C. It is significant to note that the series connection of capacitors $C_0$ and $C_1$ that would result from a simple single-ended to differential circuit conversion may be replaced with appropriately scaled parallel capacitor pairs $C'_0$ and $C'_1$ as illustrated in FIG. 8C. In this regard, resistors $R_0$ in both differential input paths along with the parallel capacitor pair $C'_0$ contribute the real pole with the remaining differential circuit components contributing to the complex pole pairs. Each of the scaled parallel capacitor pairs, $C'_0$ and $C'_1$ may be implemented as a step-wise variable capacitor comprising a base fixed capacitor and an array of switchable capacitors. As further illustrated in FIG. 8C, the upper plate of a variable capacitor, $C'_1$, may be electrically coupled within the Rauch-filter at node 327. Similarly, the lower plate of the variable capacitor, $C'_1$, may be electrically coupled within the Rauch-filter at node 329.

Figure 9:
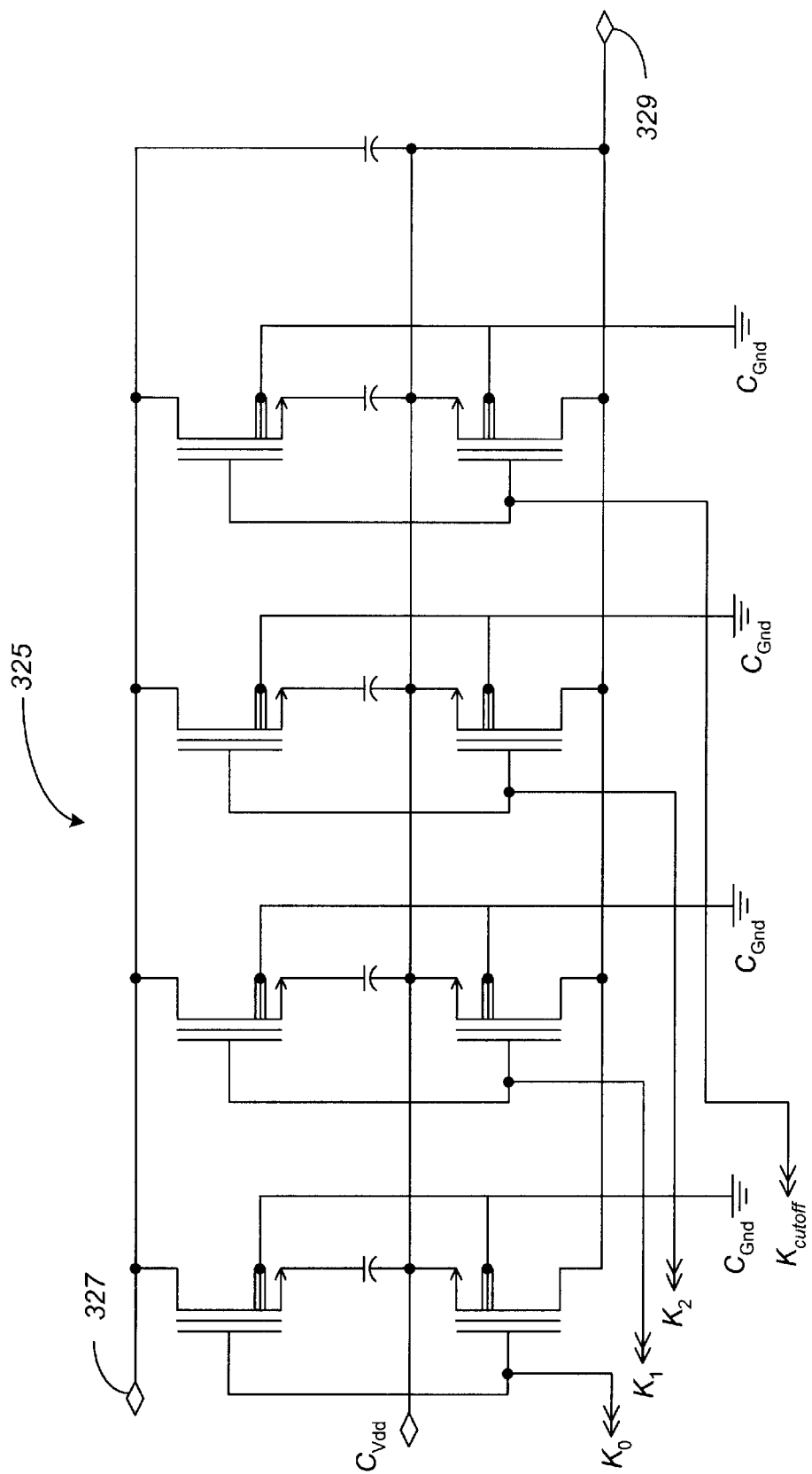
FIG. 9 is a circuit diagram of a variable capacitor that may be used (multiple times) to implement the differential $3^{rd}$ order Rauch-filter of FIG. 8C.

As by way of example, the implementation of one variable capacitor, $C'_1$ 325 of a parallel capacitor pair is shown in FIG. 9. As illustrated in FIG. 9, the variable capacitor 325 may comprise a fixed capacitor herein designated $C_{fixed}$, as well as, an array of controllably switched capacitors. As further illustrated in FIG. 9, each of the controllably switched capacitors comprising the variable capacitor 325 may be coupled to node 327 via a controllable integrated switch in series with each individual capacitor upper plate. Similarly, each of the controllably switched capacitors comprising the variable capacitor 325 may be coupled to node 329 via a controllable integrated switch in series with each individual capacitor bottom plate. Control input $K_{cutoff}$ may be supplied to select a high or low cutoff frequency in accordance with the selected or currently operable xDSL communication standard. In addition, control inputs $K_0$, $K_1$, and $K_2$ may be provided to further calibrate or tune the selected smoothing filter cutoff frequency. It will be appreciated by those skilled in art that the aforementioned control inputs may be coupled to a CO-DSP 3 (see FIG. 1) in order to provide for a programmable and tunable continuous-time smoothing filter 38 in accordance with the teachings of the present invention. The integration circuitry required to couple the various control inputs of the variable capacitor 325 of FIG. 9 need not be illustrated or explained herein to appreciate the continuous-time smoothing filter 38 of the present invention.

In a preferred embodiment of the continuous-time smoothing filter 38 (see FIGS. 4 and 8A), each of the integrated resistors is fixed. It will be appreciated by those skilled in the art that each of the resistors $R_0$, $R_1$, $R_2$, and $R_3$ illustrated in FIG. 8C may be adjustable by adding a plurality of controllable integrated switches in various circuit configurations with a plurality of integrated resistors. Those skilled in the art will appreciate the various schematic layouts that may be configured to generate one or more variable resistors that may be integrated with the differential version of the $3^{rd}$ order Rauch-filter 315" of FIG. 8C. As a result, circuit schematic examples implementing one or more configurable variable resistances need not be illustrated to appreciate the continuous-time smoothing filter 38 of the present invention.

Two $3^{rd}$ order Rauch-filter like filter sections with digital control of the cut-off frequency are sufficient under 3-bit control to bring the output of the continuous-time smoothing filter 38 under the power spectral density limit 257 (see FIGS. 7A, 7B) prescribed by an applicable xDSL standard. Those skilled in the art will appreciate that a combination of on-chip resistors $R_0$, $R_1$, $R_2$, and $R_3$ as illustrated in the differential circuit of FIG. 8C may be combined with the digitally controllable array of capacitors configured to implement each of the scaled parallel capacitor pairs, $C'_0$ and $C'_1$ further illustrated in FIG. 8C to realize transmit bandwidths of 1104 kHz and 554 kHz.

Figure 10:
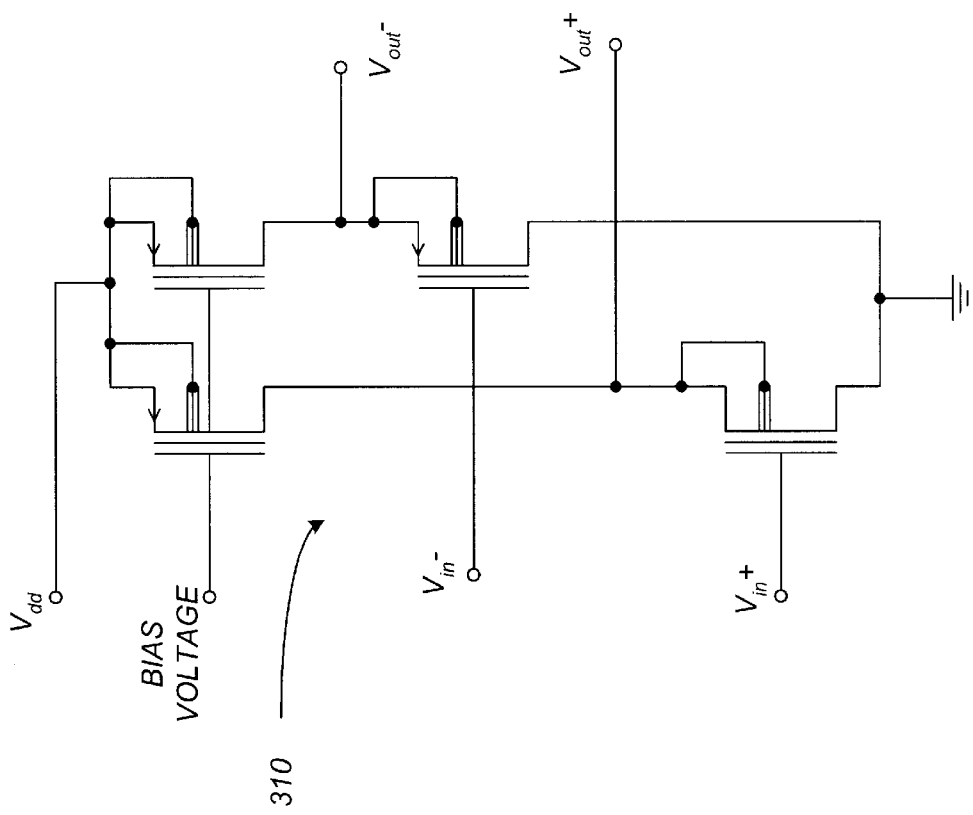
FIG. 10 is a circuit diagram of the output stage of the continuous-time smoothing filter of FIG. 8A.

Having briefly introduced a circuit in FIG. 9 that may be implemented to generate the variable capacitor 325 as illustrated in the functional block diagram of FIG. 8A, reference is now directed to FIG. 10. In this regard, FIG. 10 is a circuit schematic of an output stage 310 that may be used in the continuous-time smoothing filter of FIG. 8A. As illustrated in FIG. 10 the differential version of the output stage 310 may be implemented using a source follower circuit. The circuit achieves a sufficiently low output impedance to drive off-chip loads, including reactive (capacitive or inductive) loads which can occur, e.g., due to wire inductance and input capacitance of a CO-line driver 7 (see FIG. 1) power amplifier. The low output impedance of the output stage 310 also reduces the likelihood that reflections from transmission line 12 (see FIG. 1) loads will cause signal distortion. Since signal distortion in the output stage 310 may vary directly with the bias voltage provided to the output stage, the bias voltage may be controllably limited at the input to the output stage 310 in order to limit signal distortion that may be introduced by the continuous-time smoothing filter 38.

The combination of integrated resistors (fixed in a preferred embodiment) and variable capacitors used to comprise the two $3^{rd}$ order Rauch-filter like filter sections, when adjusted to realize transmit bandwidths of 1104 kHz and 554 kHz and used in combination with the output amplifier of FIG. 10, are capable of driving an off-chip (non-integrated) load of 20 pF/5 kOhms. A continuous-time smoothing filter 38 in accordance with the present invention can support the aforementioned prescribed load along with a transmit channel output voltage swing of 4.5 Vpp.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Therefore, having thus described the invention, at least the following is claimed:

1. A continuous-time filter for smoothing a digital to analog converter output signal, comprising:

a first low-pass filter having a programmable cut-off frequency;

a second low-pass filter having a programmable cut-off frequency, the first and second low-pass filters configured to remove images introduced at multiples of a sampling rate used in converting a digital data stream in a digital to analog conversion; and an output stage amplifier having a low output impedance.

2. The filter of claim 1, wherein the programmable cut-off frequency is applied in response to an applicable digital subscriber line application mode.

3. The filter of claim 1, wherein the programmable cut-off frequency is tunable to compensate for manufacturing variances in individual circuit components.

4. The filter of claim 1, wherein each of the first and second low-pass filters comprise a $3^{rd}$ order filter with one operational amplifier.

5. The filter of claim 1, wherein each of the first and second low-pass filters are implemented in separate circuits.

6. The filter of claim 1, wherein the low output impedance output stage amplifier is configured to accept an externally adjustable bias voltage responsive to bias current in the amplifier.

7. The filter of claim 1, wherein the output stage amplifier achieves an output impedance sufficiently low to drive an external load.

8. The filter of claim 2, wherein the programmable cut-off frequency is configured to support at least two operating modes distinguishable by a transmit bandwidth.

9. The filter of claim 2, wherein the programmable cut-off frequency is configured to support a transmit bandwidth of 1104 kHz.

10. The filter of claim 2, wherein the programmable cut-off frequency is configured to support a transmit bandwidth of 554 kHz.

11. The filter of claim 3, wherein programmable cut-off frequency tuning is performed by controllably adjusting a stepped variable capacitor.

12. The filter of claim 4, wherein each of the first and second low-pass filters realize a negative real pole and a complex low-Q pole pair.

13. The filter of claim 5, wherein each of the separate circuits is a fully differential configuration of a low-pass Rauch-filter.

14. The filter of claim 11, wherein the stepped variable capacitor is implemented via a parallel combination of at least one switchable capacitor with a base fixed capacitor.

15. The filter of claim 12, wherein the complex low-Q pole pair has a Q value substantially less than 1.

16. The filter of claim 13, wherein the output stage amplifier is capable of driving a load of 20 pF/5 kOhms on each of the differential outputs.

17. The filter of claim 15, wherein the Q value is preferably lower than 0.9.

18. The filter of claim 17, wherein the output stage amplifier supports a signal swing of 4.5 Vpp.

19. A central office digital subscriber line transmission unit comprising:
    a first low-pass filter having a programmable cut-off frequency;
    a second low-pass filter having a programmable cut-off frequency, the first and second low-pass filters configured to remove images introduced at multiples of a sampling rate used in converting a digital data stream in a digital to analog conversion; and
    an output stage amplifier having a low output impedance.

20. An integrated circuit comprising:
    a first low-pass filter having a programable cut-off frequency;
    a second low-pass filter having a programmable cut-off frequency, the first and second low-pass filters configured to remove images introduced at multiples of a sampling rate used in converting a digital data stream in a digital to analog conversion; and
    an output stage amplifier having a low output impedance.

21. The filter of claim 20, further comprising:
    a control interface for adjusting the programmable cut-off frequency in accordance with a digital subscriber line communication standard.

22. The filter of claim 21, wherein the control interface comprises a digital adjustment.

23. The filter of claim 22, wherein the digital adjustment comprises a 3-bit control signal.

24. A method for providing continuous-time smoothing in an analog front end, comprising:
    processing a digital to analog converter generated output signal with a first $3^{rd}$ order low-pass filter;
    processing a first output signal provided by the first $3^{rd}$ order low-pass filter with a second $3^{rd}$ order low-pass filter; and
    processing a second output signal provided by the second $3^{rd}$ order low-pass filter with a low-output impedance amplifier.

25. The method of claim 24, further comprising:
    calibrating the filter to reduce the effects of manufacturing process variation.

26. The method of claim 24, further comprising:
    controllably adjusting the cut-off frequency of both the first and the second $3^{rd}$ order low-pass filters in response to digital subscriber line application modes.

27. The method of claim 25, wherein the step of calibrating is performed by controllably adjusting at least one stepped variable capacitor.

28. The method of claim 26, wherein the programmable cut-off frequency of both the first and the second $3^{rd}$ order low-pass filters are configured to support a transmit bandwidth of 1104 kHz.

29. The method of claim 26, wherein the programmable cut-off frequency of both the first and the second $3^{rd}$ order low-pass filters are configured to support a transmit bandwidth of 554 kHz.

30. The method of claim 27, wherein the step of calibrating is performed via a digital control signal.

31. A continuous-time smoothing filter for an analog front end, comprising:
    means for providing a $6^{th}$ order filter with 2 real poles and 4 complex poles whose Q-factor does not exceed 0.9;
    means wherein said means for providing a $6^{th}$ order filter includes for providing a programmable cut-off frequency; and means coupled to said means for providing a $6^{th}$ order filter for driving an off-chip reactive load.

32. The filter of claim 31, wherein the means for providing a programmable cut-off frequency is performed via a step-wise adjustment of at least one switched array of integrated capacitors.

33. The filter of claim 31, wherein the means for providing a $6^{th}$ order filter comprises a cascade of two $3^{rd}$ order filters.

* * * * *